(12) United States Patent
Wada

(10) Patent No.: US 11,873,199 B2
(45) Date of Patent: Jan. 16, 2024

(54) ARTICLE TRANSPORT FACILITY

(71) Applicant: Daifuku Co., Ltd., Osaka (JP)

(72) Inventor: Yoshinari Wada, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 17/748,538

(22) Filed: May 19, 2022

(65) Prior Publication Data

US 2022/0371866 A1 Nov. 24, 2022

(30) Foreign Application Priority Data

May 20, 2021 (JP) ................................ 2021-085321

(51) Int. Cl.
*B66F 9/075* (2006.01)
*B66F 9/20* (2006.01)
(52) U.S. Cl.
CPC .............. *B66F 9/0755* (2013.01); *B66F 9/20* (2013.01)
(58) Field of Classification Search
CPC . B65G 47/61; B65G 1/0414; H01L 21/67775; H01L 21/67733; H01L 21/67736; H01L 21/6773; B66F 9/20; B66F 9/0755
See application file for complete search history.

(56) References Cited

U.S. PATENT DOCUMENTS

| | | | | |
|---|---|---|---|---|
| 3,817,406 A | * | 6/1974 | Sawada | B65G 1/0414 414/281 |
| 4,459,078 A | * | 7/1984 | Chiantella | B65G 1/0414 414/284 |
| 6,149,366 A | * | 11/2000 | Deandrea | B65G 1/0414 414/279 |
| 2013/0134120 A1 | * | 5/2013 | Won | H01L 21/67733 212/328 |
| 2016/0074261 A1 | * | 3/2016 | Schoenian | A61G 3/062 414/462 |

FOREIGN PATENT DOCUMENTS

| | | |
|---|---|---|
| JP | H42886 Y2 | 1/1992 |
| JP | H6321316 A | 11/1994 |
| JP | 2001206505 A | 7/2001 |
| KR | 1020150072840 A | 6/2015 |

* cited by examiner

*Primary Examiner* — Glenn F Myers
(74) *Attorney, Agent, or Firm* — The Webb Law Firm

(57) ABSTRACT

A transfer device includes a holder that holds an article, and a self-propelled cart that supports the holder and travels. The self-propelled cart includes a wheel and a wheel drive source that drives the wheel, and the self-propelled cart travels along a traveling path provided on an elevation unit and a delivery device. The delivery device includes a positioning portion that positions the elevation unit while the elevation unit is at a transfer height, and a delivery-side guide that guides travel of the self-propelled cart along the traveling path. The elevation unit includes an elevation-side guide that guides travel of the self-propelled cart along the traveling path, and the elevation-side guide is arranged so as to be continuous with the delivery-side guide while the elevation unit is positioned by the positioning portion.

6 Claims, 5 Drawing Sheets

ARTICLE TRANSPORT FACILITY

CROSS-REFERENCE TO RELATED APPLICATION

This application claims priority to Japanese Patent Application No. 2021-085321 filed May 20, 2021, the disclosure of which is hereby incorporated by reference in its entirety.

BACKGROUND OF THE INVENTION

1. Field of the Invention

The present invention relates to an article transport facility that includes an article transport vehicle that transports articles and a delivery device that is a delivery destination for articles transported by the article transport vehicle.

2. Description of the Related Art

An example of such an article transport facility is disclosed in Korean Published Patent No. 10-2015-0072840 (Patent Document 1). In this description of the related art, the reference signs used in Patent Document 1 are noted in parentheses.

The article transport facility of Patent Document 1 includes a transport cart (200) that transports objects (M), and a loading section (P1) that is a delivery destination for an object (M) transported by the transport cart (200). The transport cart (200) includes a traveling carrier unit (230), an object storage section (251) that ascends and descends relative to the carrier unit (230), and a transfer unit (250) mounted on the object storage section (251). The transfer unit (250) includes an object support section (253*a*) that supports an object (M), and transfers the object (M) between the object support section (253*a*) and the loading section (P1).

As shown in FIG. 5 of Patent Document 1, in the article transport facility of Patent Document 1, the loading section (P1) is arranged at a position horizontally displaced from the traveling path of the carrier unit (230), and the transfer unit (250) includes a transfer drive module (255) that causes the object support section (253*a*) to move toward and away (protrude and retract) from the object storage section (251) in the horizontal direction. As shown in FIG. 7 of Patent Document 1, an object (M) is transferred between the object support section (253*a*) and the loading section (P1) while the object support section (253*a*) has been caused to protrude toward the loading section (P1) by the transfer drive module (255).

As shown in FIGS. 6 to 9 of Patent Document 1, the above-described transfer drive module (255) is configured using a two-stage slide mechanism. Specifically, the transfer drive module (255) includes a sliding plate (253*b*) that is coupled to the object storage section (251) via one linear guide and is coupled to the object support section (253*a*) via another linear guide, and the object support section (253*a*) is moved toward and away from the object storage section (251) by causing the sliding plate (253*b*) to slide over the object storage section (251) and causing the object support section (253*a*) to slide over the sliding plate (253*b*).

As described above, in the article transport facility of Patent Document 1, the transfer unit, which is mounted on the object storage section that ascends and descends relative to the carrier unit, can cause the object support section that supports an object to move horizontally toward and away from the object storage section. In other words, a transfer device mounted on an elevation unit that ascends and descends relative to a traveling cart can cause a holder that holds an article to move horizontally toward and away from the elevation unit. Also, when an article is to be transferred between the holder and the delivery device (the loading section in Patent Document 1), the transfer device causes the holder to protrude toward the elevation unit to a transfer position at which article transfer is to be performed.

In the article transport facility of Patent Document 1, a deployment mechanism (specifically, a two-stage slide mechanism) for causing the holder to move toward and away from the elevation unit is provided in the transfer device, and this deployment mechanism guides the movement of the holder toward the transfer position. For this reason, the deployment mechanism is required to have a stroke length and rigidity that are sufficient for appropriately guiding the holder to the transfer position. As a result, the structure of the deployment mechanism becomes more complex in order to ensure such a stroke length and rigidity, and for this reason for example, the transfer device that includes the deployment mechanism tends to increase in weight. From the viewpoint of reducing the power consumption of the article transport vehicle (the transport cart in Patent Document 1) for example, it is desirable to keep the weight of the article transport vehicle as low as possible, but with the article transport facility of Patent Document 1, the weight of the transfer device tends to increase as described above, and it is difficult to reduce the weight of the article transport vehicle.

SUMMARY OF THE INVENTION

In view of the above, it is desirable to realize an article transport facility that can facilitate reduction of the weight of the article transport vehicle while also enabling the holder to be appropriately guided to a transfer position where article transfer is to be performed.

An article transport facility according to an aspect of this disclosure includes: an article transport vehicle configured to transport an article; and a delivery device configured to be a delivery destination of the article transported by the article transport vehicle, wherein the article transport vehicle includes: a traveling cart configured to travel; an elevation unit configured to be raised and lowered relative to the traveling cart; and a transfer device mounted on the elevation unit, the elevation unit is raised and lowered between a traveling height that is a reference height during traveling of the traveling cart, and a transfer height for transfer of the article with the delivery device by the transfer device, the transfer device includes: a holder configured to hold the article; and a self-propelled cart configured to support the holder and travel, the self-propelled cart includes: a wheel; and a wheel drive source configured to drive the wheel, the self-propelled cart travels along a traveling path provided on the elevation unit and the delivery device, the delivery device includes: a positioning portion configured to position the elevation unit while the elevation unit is at the transfer height; and a delivery-side guide configured to guide travel of the self-propelled cart along the traveling path, the elevation unit includes an elevation-side guide configured to guide travel of the self-propelled cart along the traveling path, and the elevation-side guide is arranged in such a manner as to be continuous with the delivery-side guide while the elevation unit is positioned by the positioning portion.

According to this configuration, the elevation-side guide and the delivery-side guide are arranged so as to be continuous with each other while the elevation unit is positioned by the positioning portion of the delivery device, and thus the traveling of the self-propelled cart can be guided by the elevation-side guide and the delivery-side guide over the entirety of the traveling path between the elevation unit and the delivery device. Accordingly, the self-propelled cart and the holder supported thereby can be appropriately guided to the transfer position where the article is transferred between the holder and the delivery device.

In this configuration, in the portion of the traveling path on the elevation unit side of the junction between the elevation-side guide and the delivery-side guide, the traveling of the self-propelled cart is guided by the elevation-side guide provided in the elevation unit, and in the portion of the traveling path on the delivery device side of the junction, the traveling of the self-propelled cart is guided by the delivery-side guide provided in the delivery device. In this way, the traveling of the self-propelled cart in the portion of the traveling path on the delivery device side is guided by the delivery-side guide provided in the delivery device, and thus the configuration of the elevation-side guide can be made simpler than in the case where the elevation-side guide provided in the elevation unit guides the traveling of the self-propelled cart in the portion on the delivery device side as well. As a result, it is easier to reduce the weight of the elevation unit on which the transfer device is mounted, and thus reduce the weight of the article transport vehicle.

As described above, according to the above configuration, it is possible to facilitate reduction of the weight of the article transport vehicle while also enabling the holder to be appropriately guided to a transfer position where article transfer is to be performed.

Further features and advantages of the article transport facility will become apparent from the following description of embodiments given with reference to the drawings.

DETAILED DESCRIPTION OF PREFERRED EMBODIMENTS

The following describes embodiments of an article transport facility with reference to the drawings.

Figure 1:
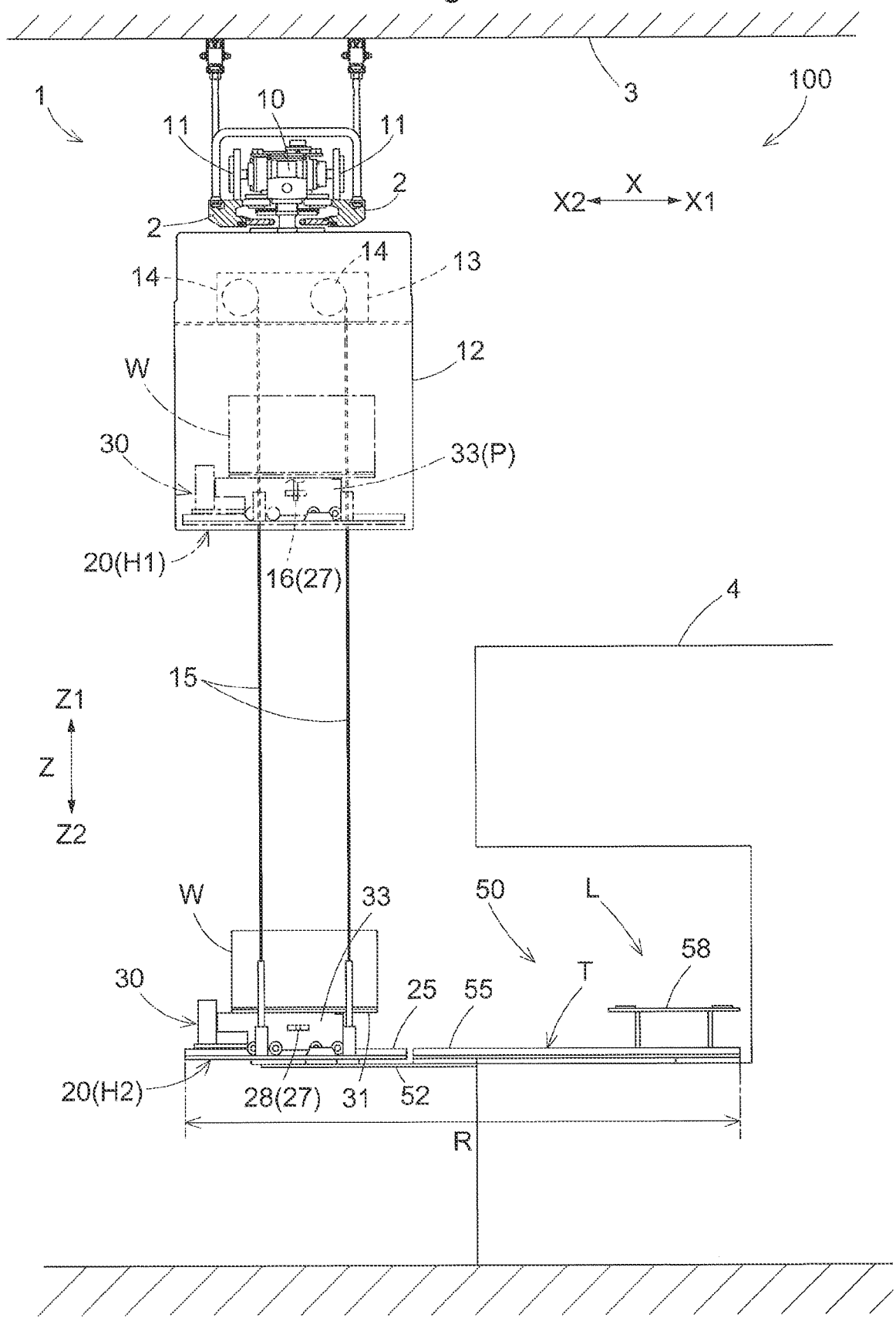
FIG. 1 is a front view of a portion of an article transport facility.

As shown in FIG. 1, an article transport facility 100 includes an article transport vehicle 1 that transfers an article W, and a delivery device 50 that is a delivery destination for the article W transferred by the article transport vehicle 1. Although there are no limitations on the type of the article W, here, the article W is a container in which an object is stored. One example of the container is a cassette that stores a plurality of trays that support IC chips.

As shown in FIG. 1, the article transport vehicle 1 includes a traveling cart 10 that travels, an elevation unit 20 that ascends and descends relative to the traveling cart 10, and a transfer device 30 that is mounted on the elevation unit 20. In the present embodiment, the traveling cart 10 travels along a traveling path formed along a ceiling 3. In the example shown in FIG. 1, the traveling path is formed by rails 2 (here, a pair of rails 2) that are suspended from and supported by the ceiling 3. The traveling cart 10 includes traveling wheels 11 that roll on traveling surfaces (in this case, the upper surfaces) of the rails 2, and the traveling wheels 11 are driven to rotate by driving force from a drive source such as an electric motor, and thus the traveling cart 10 travels along the rails 2. Thus, in the present embodiment, the article transport vehicle 1 is an overhead transport vehicle that travels along a traveling path formed along the ceiling 3. Note that the article transport vehicle 1 may be a transport vehicle other than an overhead transport vehicle.

The elevation unit 20 ascends and descends between a traveling height H1 that is a reference height during traveling of the traveling cart 10, and a transfer height H2 that is the height at which the article W is transferred to or from the delivery device 50 by the transfer device 30. The height referred to here is the position in an up-down direction Z (vertical direction). In FIG. 1, the elevation unit 20 located at the traveling height H1 is shown by dashed-dotted lines, and the elevation unit 20 located at the transfer height H2 is shown by solid lines.

The traveling height H1 is a height set based on the height of the traveling cart 10. In the present embodiment, the article transport vehicle 1 includes a cover portion 12 that is coupled to the traveling cart 10, and the traveling height H1 is set to the height at which the elevation unit 20, the transfer device 30, and the article W held by the transfer device 30 (specifically, a holder 31 described later) are arranged in the interior space of the cover portion 12. In the example shown in FIG. 1, the cover portion 12 is supported by the traveling cart 10 at a position lower than (on the downward side Z2 of) the traveling cart 10, and the interior space of the cover portion 12 is open at least toward the downward side Z2.

The transfer height H2 is set according to the height of each delivery device 50. In the present embodiment, the transfer height H2 is set lower than (on the downward side Z2 of) the traveling height H1. In the example shown in FIG. 1, the delivery device 50 is a load port of a processing device 4 for processing the article W. As one example, the processing device 4 is a device that removes an object (the article W) from the container and performs processing on the object. Note that the delivery device 50 is not limited to being the load port of the processing device 4, and the delivery device 50 can be an article W loading/unloading section (e.g., a placement table or a conveyor) of a storage device that stores the articles W.

The article transport vehicle 1 includes an elevation device 13 that raises and lowers the elevation unit 20 relative to the traveling cart 10. In the present embodiment, the elevation device 13 raises and lowers the elevation unit 20 while supporting the elevation unit 20 in a suspended state. Specifically, the elevation device 13 includes transmission members 15, such as belts or wires, and rotating bodies 14 around which the transmission members 15 are wound. The elevation unit 20 is coupled to the leading end portions of the transmission members 15 (in this example, the leading end portions of four transmission members 15; see FIG. 2), and the elevation device 13 raises or lowers the elevation unit 20 by rotating the rotating bodies 14 with use of driving force from a drive source such as an electric motor so as to wind or unwind the transmission members 15.

Figure 2:
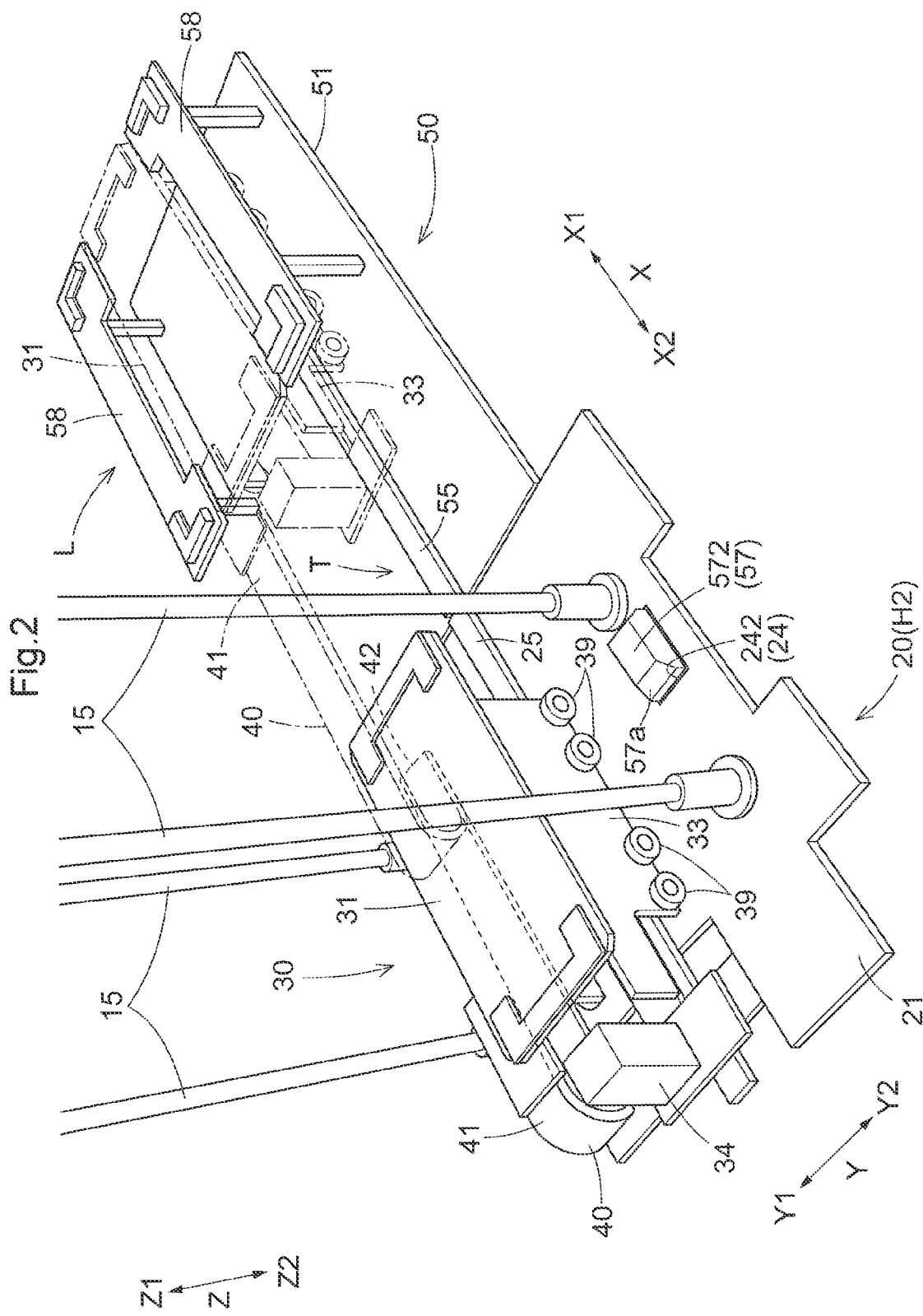
FIG. 2 is a perspective view of an elevation unit and a delivery device.
Figure 4:
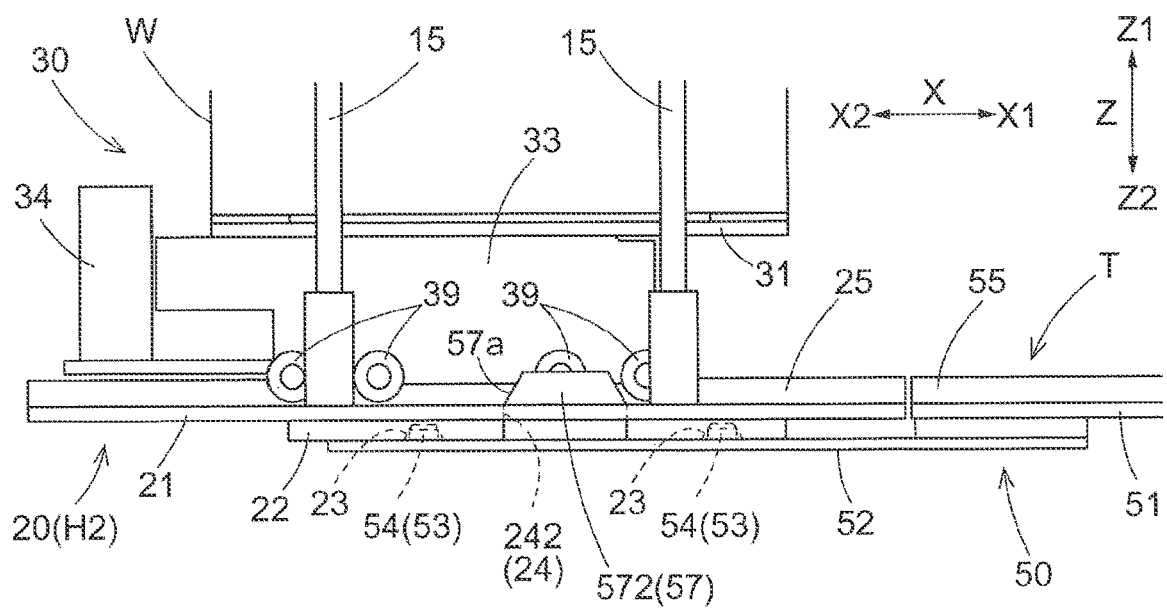
FIG. 4 is a front view of the elevation unit.

As shown in FIG. 2, the transfer device 30 includes a holder 31 that holds an article W and a self-propelled cart 33 that travels while supporting the holder 31. The transfer device 30 performs the transfer of an article W with the delivery device 50 by transferring the article W between the holder 31 and the delivery device 50. As shown in FIG. 4, in the present embodiment, the holder 31 holds the article W by supporting the article W from below (downward side Z2). In other words, the article W is held by the holder 31 in a state of being placed on the holder 31. In the present embodiment, the holder 31 is supported by the self-propelled cart 33 so as to be able to be raised and lowered. The transfer device 30 raises and lowers the holder 31 with use of driving force from a drive source such as an electric motor.

Figure 3:
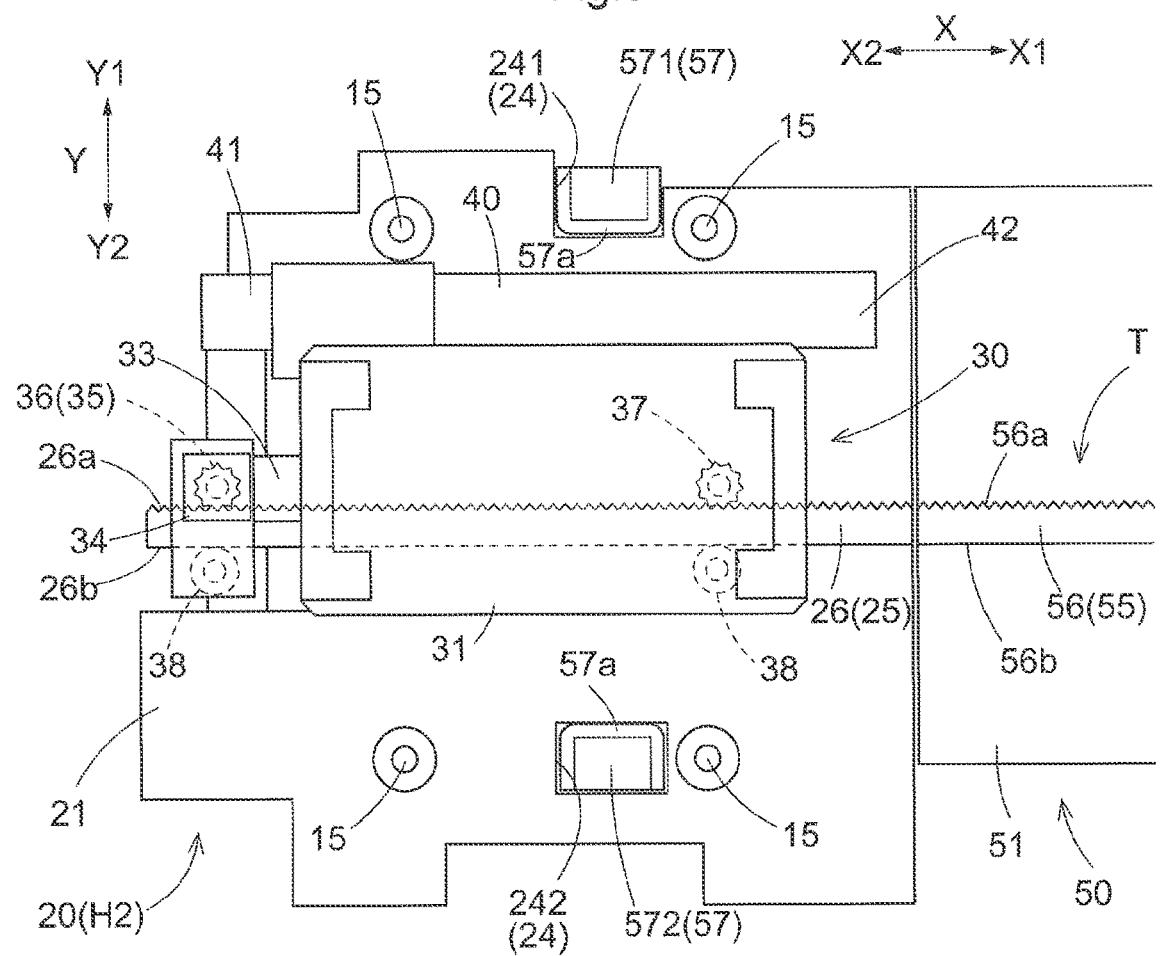
FIG. 3 is a plan view of the elevation unit.
Figure 5:
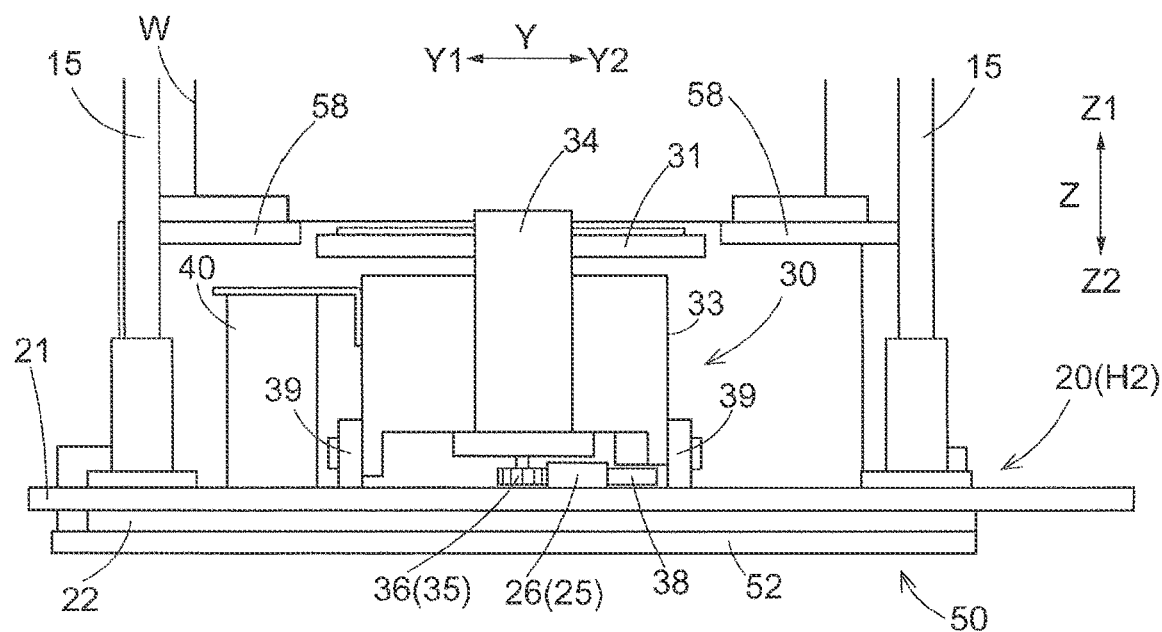
FIG. 5 is a side view of the elevation unit.

As shown in FIGS. 3 and 5, the self-propelled cart 33 includes a wheel 35 and a wheel drive source 34 (e.g., an electric motor) that drives the wheel 35. The self-propelled cart 33 travels on a traveling path T provided in the elevation unit 20 and the delivery device 50. Specifically, the self-propelled cart 33 travels on the traveling path T due to the wheel 35 being driven to rotate by the wheel drive source 34. The self-propelled cart 33 is arranged on the elevation unit 20 when the elevation unit 20 is raised or lowered (see FIG. 1).

Here, a traveling path direction X is defined as the direction along the traveling path T. Also, a first side X1 in the traveling path direction is defined as the side on which the delivery device 50 is located relative to the elevation unit 20 in the traveling path direction X, a second side X2 in the traveling path direction is defined as the side opposite to the first side X1 in the traveling path direction X. In the present embodiment, the traveling path direction X is the horizontal direction. Also, a width direction Y is defined as the direction orthogonal to the traveling path direction X in a vertical view along the up-down direction Z (i.e., a plan view). A first side Y1 in the width direction is defined as one side in the width direction Y, and a second side Y2 in the width direction is defined as the other side in the width direction Y. In the present embodiment, the width direction Y is the horizontal direction, which is orthogonal to the traveling path direction X. Also, in the present embodiment, the width direction Y coincides with the traveling direction of the traveling cart 10. In other words, the traveling path direction X is orthogonal to the traveling direction of the traveling cart 10 in a vertical view. In the present embodiment, the first side Y1 in the width direction corresponds to "one side in the width direction" and the second side Y2 in the width direction corresponds to "the other side in the width direction".

In the present embodiment, the wheel 35 is not configured to support the weight of the self-propelled cart 33, and the self-propelled cart 33 includes support wheels 39 that support the weight of the self-propelled cart 33, in addition to the wheel 35. The support wheels 39 come into contact with a traveling surface of the self-propelled cart 33 and support the self-propelled cart 33. Specifically, the support wheels 39 support the self-propelled cart 33 by coming into contact with the upper surface of the elevation unit 20 (in this example, the upper surface of an elevation body 21, which will be described later) and the upper surface of the delivery device 50 (in this example, the upper surface of a first support body 51, which will be described later). The support wheels 39 are rotatably attached to the self-propelled cart 33.

The elevation unit 20 includes an elevation-side guide 25 that guides the traveling of the self-propelled cart 33 along the traveling path T. The self-propelled cart 33 travels along the traveling path T on the elevation unit 20 while being guided by the elevation-side guide 25. In the present embodiment, the elevation-side guide 25 is provided on the upper surface of the elevation body 21 provided in the elevation unit 20. The self-propelled cart 33 travels along the traveling path T while being supported from below (downward side Z2) by the elevation body 21 and furthermore guided by the elevation-side guide 25. Note that the leading end portions of the transmission members 15 described above are coupled to the upper surface of the elevation body 21.

The delivery device 50 includes a delivery-side guide 55 that guides the traveling of the self-propelled cart 33 along the traveling path T. The self-propelled cart 33 travels along the traveling path T on the delivery device 50 while being guided by the delivery-side guide 55. In the present embodiment, the delivery-side guide 55 is provided on the upper surface of the first support body 51 provided in the delivery device 50. The self-propelled cart 33 travels along the traveling path T while being supported by the first support body 51 from below (downward side Z2) and furthermore guided by the delivery-side guide 55.

As shown in FIG. 3, in the present embodiment, the delivery-side guide 55 and the elevation-side guide 25 are gear racks. Specifically, the elevation-side guide 25 is a first gear rack 26 and the delivery-side guide 55 is a second gear rack 56. The first gear rack 26 is fixed to the elevation unit 20 (in this example, the elevation body 21), and the second gear rack 56 is fixed to the delivery device 50 (in this example, the first support body 51). The first gear rack 26 and the second gear rack 56 are arranged so as to extend in the traveling path direction X. In the following, when describing matter common to both the first gear rack 26 and the second gear rack 56, the term "gear rack (26, 56)" will be used instead of making a distinction. In the present embodiment, the first gear rack 26 and the second gear rack 56 each correspond to "gear rack".

As shown in FIGS. 3 and 5, in the present embodiment, the wheel 35 includes a drive pinion gear 36 that is meshed with the gear rack (26, 56). Here, the wheel 35 includes only the drive pinion gear 36. In other words, the wheel 35 is the drive pinion gear 36. The drive pinion gear 36 is meshed with the first gear rack 26 or the second gear rack 56, depending on the position of the self-propelled cart 33 in the traveling path direction X. The drive pinion gear 36 is rotatably supported by the self-propelled cart 33 and is driven to rotate by the wheel drive source 34. In the present embodiment, the drive pinion gear 36 corresponds to "pinion gear".

In the example shown in FIG. 3, the self-propelled cart 33 includes a driven pinion gear 37 that is meshed with the gear rack (26, 56), separately from the drive pinion gear 36. The driven pinion gear 37 is meshed with the first gear rack 26 or the second gear rack 56, depending on the position of the self-propelled cart 33 in the traveling path direction X. The driven pinion gear 37 is rotatably supported by the self-propelled cart 33 and rotates in conjunction with the rotation of the drive pinion gear 36. The driven pinion gear 37 is positioned at a different position in the traveling path direction X from the drive pinion gear 36, and in the example shown in FIG. 3, is positioned on the first side X1 in the traveling path direction relative to the drive pinion gear 36.

The drive pinion gear 36 is driven to rotate by the wheel drive source 34, and the drive pinion gear 36 moves in the traveling path direction X relative to the gear rack (26, 56), and thus the self-propelled cart 33 moves in the traveling path direction X. The side toward which the self-propelled cart 33 moves in the traveling path direction X is determined by the direction in which the drive pinion gear 36 rotates. In other words, by switching the direction of rotation of the drive pinion gear 36, the self-propelled cart 33 is switched between a state of moving toward the first side X1 in the traveling path direction and a state of moving toward the second side X2 in the traveling path direction.

In the present embodiment, the tooth surface of each gear rack (26, 56) is arranged so as to face the first side Y1 in the width direction. Specifically, a first tooth surface 26a, which is the tooth surface of the first gear rack 26, is arranged so as to face the first side Y1 in the width direction, and a second tooth surface 56a, which is the tooth surface of the second gear rack 56, is arranged so as to face the first side Y1 in the width direction. The drive pinion gear 36 is supported so as to rotate about an axis extending along the up-down direction Z. The driven pinion gear 37 is also supported so as to rotate about an axis along the up-down direction Z. The self-propelled cart 33 further includes guide wheels 38 (in the present example, freely rotating wheels) that are supported so as to rotate about an axis extending along the up-down direction Z. The guide wheels 38 are rotatably supported by the self-propelled cart 33. The guide wheels 38 are arranged so as to roll along the back surface of the gear rack (26, 56), which is the side facing the second side Y2 in the width direction. The guide wheels 38 roll along a first back surface 26b, which is the back surface of the first gear rack 26, or along a second back surface 56b, which is the back surface of the second gear rack 56, depending on the position of the self-propelled cart 33 in the traveling path direction X. In the present embodiment, the first tooth surface 26a and the second tooth surface 56a correspond to "tooth surface", and the first back surface 26b and the second back surface 56b correspond to "back surface".

As described above, the drive pinion gear 36 and the guide wheels 38 are arranged on respective sides of the gear rack (26, 56) in the width direction Y, and thus as shown in FIG. 5, the self-propelled cart 33 can travel in the state where the gear rack (26, 56) is sandwiched between the drive pinion gear 36 and the guide wheels 38 on respective sides in the width direction Y. Accordingly, this allows the self-propelled cart 33 to travel along the traveling path direction X in which the gear rack (26, 56) extends, while also restricting movement of the self-propelled cart 33 in the width direction Y relative to the gear rack (26, 56).

In the example shown in FIG. 3, two guide wheels 38 are arranged at different positions in the traveling path direction X. One guide wheel 38 is arranged at a position corresponding to the drive pinion gear 36 in the traveling path direction X (h$_e$re, a position opposing the drive pinion gear 36 in the width direction Y), and the other guide wheel 38 is arranged at a position corresponding to the driven pinion gear 37 in the traveling path direction X (here, a position opposing the driven pinion gear 37 in the width direction Y). For this reason, the gear rack (26, 56) is sandwiched from both sides in the width direction Y by the drive pinion gear 36 and one guide wheel 38, and is also sandwiched from both sides in the width direction Y by the driven pinion gear 37 and the other guide wheel 38.

As shown in FIG. 4, the delivery device 50 includes a positioning portion 53 that positions the elevation unit 20 when the elevation unit 20 is at the transfer height H2. When the elevation unit 20 is positioned by the positioning portion 53, the elevation-side guide 25 is arranged so as to be continuous with the delivery-side guide 55 (see FIGS. 2 to 4). In other words, while the elevation unit 20 is positioned by the positioning portion 53, the elevation-side guide 25 is arranged on an extension line of the delivery-side guide 55 (specifically, on a line extended toward the second side X2 along the traveling path direction X). For this reason, while the elevation unit 20 is positioned by the positioning portion 53, the self-propelled cart 33 can move (come and go) between a position over the elevation unit 20 and a position over the delivery device 50. At the junction between the elevation-side guide 25 and the delivery-side guide 55 in the traveling path T, the end portion of the elevation-side guide 25 on the first side X1 in the traveling path direction and the end portion of the delivery-side guide 55 on the second side X2 in the traveling path direction face each other in the traveling path direction X (here, face each other across a gap).

When the self-propelled cart 33 moves between a position over the elevation unit 20 and a position over the delivery device 50, the traveling of the self-propelled cart 33 is guided by the elevation-side guide 25 and the delivery-side guide 55, which are arranged so as to be continuous with each other. Specifically, in the portion of the traveling path T on the elevation unit 20 side of the junction between the elevation-side guide 25 and the delivery-side guide 55, the traveling of the self-propelled cart 33 is guided by the elevation-side guide 25, whereas in the portion of the traveling path T on the delivery device 50 side of the junction, the traveling of the self-propelled cart 33 is guided by the delivery-side guide 55. Because the traveling of the self-propelled cart 33 over the entirety of the traveling path T between the elevation unit 20 and the delivery device 50 can be guided by the elevation-side guide 25 and the delivery-side guide 55, which are arranged so as to be continuous with each other, as shown in FIG. 2, the self-propelled cart 33 and the holder 31 supported thereby can be appropriately guided to a transfer position L at which an article W is transferred between the holder 31 and the delivery device 50. In FIG. 2, the self-propelled cart 33 and the holder 31 at the transfer position L are shown by dashed-dotted lines.

As shown in FIGS. 1 and 2, in the present embodiment, the delivery device 50 includes a support section 58 that supports the article W from below (downward side Z2) at the transfer position L. In the present embodiment, the holder 31 provided in the transfer device 30 supports a center portion, with respect to the width direction Y, of the article W from below (downward side Z2), and the support section 58 provided at the transfer position L supports two side portions, with respect to the width direction Y, of the article W from below (downward side Z2). The support section 58 is arranged outside of the space where the holder 31 moves so as not to interfere with the holder 31. By raising and lowering the holder 31 while the holder 31 is positioned at the transfer position L, the article W is transferred between the holder 31 and the delivery device 50.

Specifically, when transferring an article W from the holder 31 to the delivery device 50, the holder 31 holding the article W is raised or lowered to a set height (specifically, a height at which the bottom surface of the article W held by the holder 31 is located higher than (on the upward side Z1 of) the support section 58), and the self-propelled cart 33 is caused to travel toward the first side X1 in the traveling path direction from a position on the elevation unit 20 to the transfer position L. The holder 31 at the transfer position L is then lowered, the article W held by the holder 31 is placed on the support section 58, and then the self-propelled cart 33 is caused to travel toward the second side X2 in the traveling path direction from the transfer position L to a position on the elevation unit 20.

Also, when transferring an article W from the delivery device 50 to the holder 31, the holder 31, which is not holding an article W, is raised or lowered to another set height (specifically, as illustrated in FIG. 5, a height at which the upper surface of the holder 31 is located lower than (on the downward side Z2 of) the bottom surface of the article W supported by the support section 58), and the self-propelled cart 33 is caused to travel toward the first side X1 in the traveling path direction from a position on the elevation unit 20 to the transfer position L. The holder 31 arranged at the transfer position L is then raised, the article W supported by the support section 58 is picked up by the holder 31, the article W is held by the holder 31, and then the self-propelled cart 33 is caused to travel toward the second side X2 in the traveling path direction from the transfer position L to a position on the elevation unit 20.

As shown in FIG. 1, in the article transport facility 100, the transfer position L is displaced from the traveling path of the traveling cart 10 in the horizontal direction (specifically, displaced toward the first side X1 in the traveling path direction), and the holder 31 is moved to the transfer position L by causing the self-propelled cart 33 to travel toward the first side X1 in the traveling path direction. In other words, the holder 31 accesses the transfer position L by traveling from the second side X2 in the traveling path direction toward the transfer position L. According to this configuration in which the holder 31 is moved to the transfer position L in this way, even if the holder 31 cannot access the transfer position L from above (upward side Z1) (as illustrated in FIG. 1), the holder 31 can be moved to the transfer position L, and an article W can be transferred between the holder 31 and the delivery device 50 (in this example, the support section 58 provided at the transfer position L).

As shown in FIGS. 2 and 3, in the present embodiment, the transfer device 30 includes connection wiring 40 that connects the elevation unit 20 and the self-propelled cart 33. The connection wiring 40 can be used to transmit power and signals between the elevation unit 20 and the self-propelled cart 33. For example, a configuration is possible in which power required by the self-propelled cart 33 is supplied from the elevation unit 20 to the self-propelled cart 33 via a power supply line included in the connection wiring 40. The power required by the self-propelled cart 33 includes power for rotating the wheel 35 (in other words, drive power of the wheel drive source 34) and, in the present embodiment, power for raising and lowering the holder 31. The power supplied from the elevation unit 20 to the self-propelled cart 33 is supplied from the main body portion of the article transport vehicle 1 to the elevation unit 20 via, for example, a power supply line provided inside the transmission member 15. Note that the main body portion of the article transport vehicle 1 is a portion of the article transport vehicle 1 that is coupled to the traveling cart 10 (in other words, a portion that is not raised/lowered relative to the traveling cart 10), and in the example shown in FIG. 1, this portion includes the cover portion 12.

For example, control signals for operating the self-propelled cart 33 can be supplied from the elevation unit 20 to the self-propelled cart 33 via a signal line included in the connection wiring 40, or a detection signal from a sensor provided in the self-propelled cart 33 can be supplied from the self-propelled cart 33 to the elevation unit 20 via a signal line included in the connection wiring 40. Examples of control signals for operating the self-propelled cart 33 include control signals for the wheel drive source 34 and control signals for the drive source for raising and lowering the holder 31. Examples of a detection signal from a sensor provided in the self-propelled cart 33 include a detection signal from an encoder provided in the wheel drive source 34 and a detection signal from an encoder provided in the drive source that raises and lowers the holder 31. The control signals supplied from the elevation unit 20 to the self-propelled cart 33 are supplied from a controller provided in the main body portion of the article transport vehicle 1 to the elevation unit 20 via signal lines provided inside the transmission member 15, for example. The detection signals supplied from the self-propelled cart 33 to the elevation unit 20 are supplied from the elevation unit 20 to a controller provided in the main body portion of the article transport vehicle 1 via signal lines provided inside the transmission member 15, for example.

As shown in FIGS. 2 and 3, a first portion 41, which is one portion of the connection wiring 40, is fixed to the self-propelled cart 33, and a second portion 42, which is another portion of the connection wiring 40, is fixed to the elevation unit 20. Here, the first portion 41 is one end portion of the connection wiring 40, and the second portion 42 is the other end portion of the connection wiring 40. The first portion 41 is positioned higher than (on the upward side Z1 of) the second portion 42. The distance between the first portion 41 and the second portion 42 along the connection wiring 40 is set according to the length of a traveling range R (see FIG. 1) of the self-propelled cart 33 along the traveling path T. Here, the traveling range R of the self-propelled cart 33 is a range along the traveling path T between the position of the self-propelled cart 33 on the elevation unit 20 (in the present embodiment, a later-described predetermined position P) and the transfer position L described above. By setting the distance between the first portion 41 and the second portion 42 along the connection wiring 40 according to the length of the traveling range R as described above, it is possible to avoid the case where the traveling of the self-propelled cart 33 is hindered by the connection wiring 40.

The connection wiring 40 deforms as the self-propelled cart 33 moves along the traveling path direction X, thus allowing the self-propelled cart 33 to travel along the traveling path T in the traveling range R. Specifically, as shown in FIG. 2, the connection wiring 40 includes a folded portion between the first portion 41 and the second portion 42 along the connection wiring 40, and the folded portion is a portion corresponding to inversion of the extending direction of the connection wiring 40 from the first portion 41 to the second portion 42. The folded portion is arranged on the second side X2 in the traveling path direction relative to the first portion 41 and the second portion 42. As the self-propelled cart 33 moves toward the first side X1 in the traveling path direction, the connection wiring 40 deforms in a manner in which the folded portion moves toward the first side X1 in the traveling path direction, and as the self-propelled cart 33 moves toward the second side X2 in the traveling path direction, the connection wiring 40 deforms in a manner in which the folded portion moves toward the second side X2 in the traveling path direction, thus allowing the self-propelled cart 33 to travel along the traveling path T in the traveling range R. Although details will not be given, in the present embodiment, the connection wiring 40 includes a cable carrier (e.g., a cable bear (registered trademark)) that regulates the extending direction of the wires (power supply line, signal lines, etc.) included in the connection wiring 40.

Figure 6:
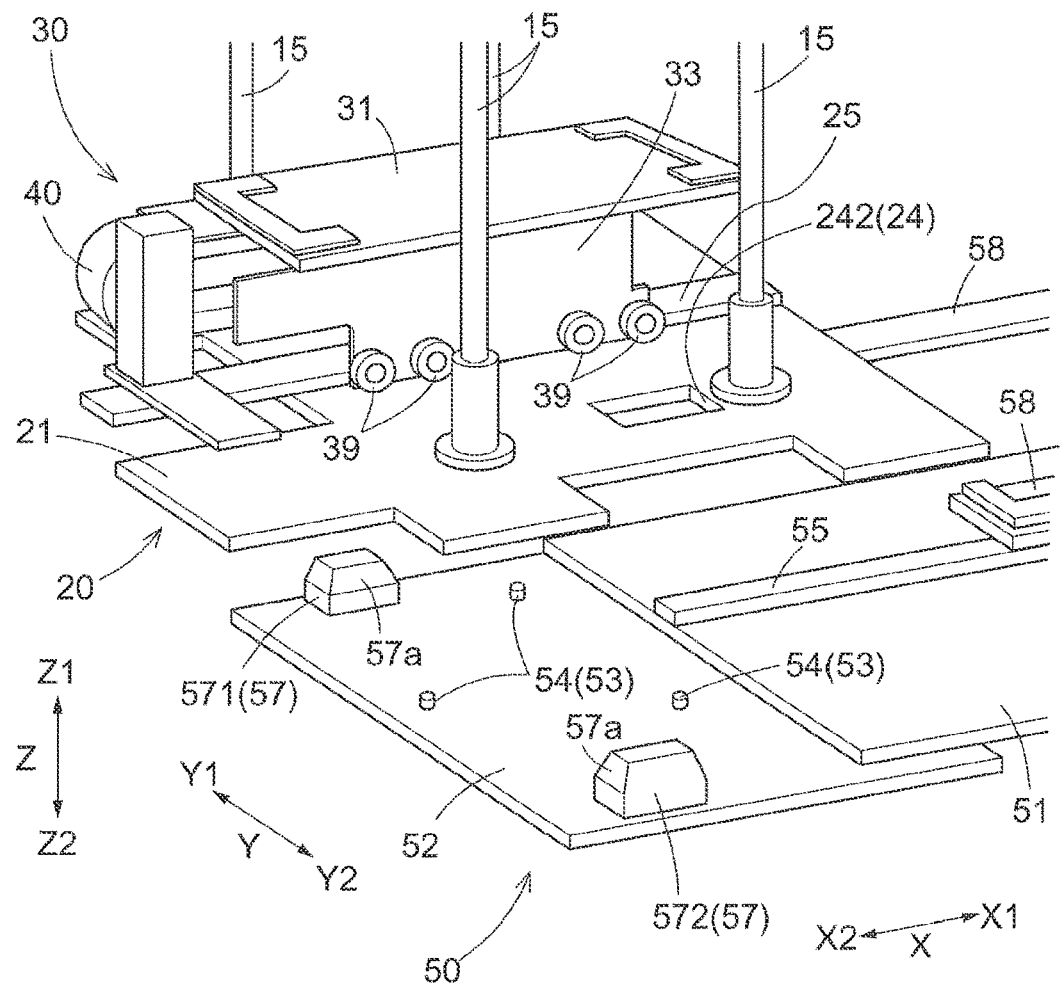
FIG. 6 is a perspective view of portions of the elevation unit and the delivery device.
Figure 7:
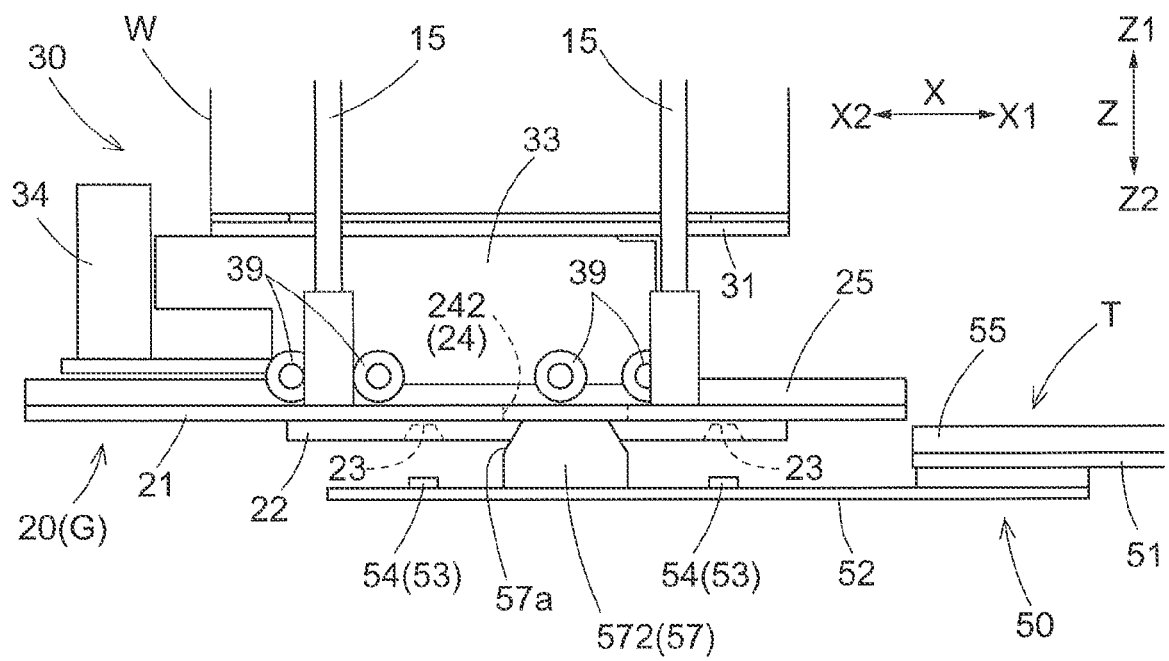
FIG. 7 is a front view of the elevation unit.

As described above, the delivery device 50 includes the positioning portion 53 that positions the elevation unit 20 while the elevation unit 20 is at the transfer height H2. As shown in FIG. 1, in the present embodiment, the delivery device 50 includes a second support body 52 at a position overlapped with the traveling path of the traveling cart 10 in a vertical view. Here, the upper surface of the second support body 52 is arranged lower than (on the downward side Z2 of) the upper surface of the first support body 51 (see FIG. 6). Also, as shown in FIGS. 4, 6, and 7, the positioning portion 53 is provided on the upper surface of the second support body 52. In this example, the second support body 52 is coupled to the first support body 51 in a state of protruding from the first support body 51 toward the second side X2 in the traveling path direction. Note that the first support body 51 and the second support body 52 may be formed as a single integrated body.

As shown in FIGS. 4 and 7, in the present embodiment, positioning recessions 23, which are recessed toward the upward side Z1, are formed in the bottom surface of the elevation unit 20. The recessions 23 are formed in a positioned portion 22 that constitutes the bottom portion of the elevation unit 20. The positioned portion 22 may be integrated with the elevation body 21. As shown in FIGS. 4 and 6, the positioning portion 53 includes pins 54 (an example of an engaging section) that engage with a corresponding recession 23. The pins 54 are formed on the upper surface of the second support body 52 so as to project toward the upward side Z1. When the pins 54 engage with the recessions 23 (see FIG. 4), the elevation unit 20 is positioned by the positioning portion 53. In this example, the positioning portion 53 includes three pins 54 (see FIG. 6) in correspondence with the three recessions 23 that are formed, and the elevation unit 20 is positioned by the positioning portion 53 when the pins 54 engage with the corresponding recessions 23.

The elevation unit 20 is positioned in the horizontal direction by engagement of the pins 54 with the recessions 23. Also, the elevation unit 20 is positioned in the up-down direction Z by being supported from below (downward side Z2) by the pins 54, or positioned in the up-down direction Z by being supported from below (downward side Z2) by the upper surface of the second support body 52.

When transferring an article W between the holder 31 and the delivery device 50, the traveling cart 10 travels to a stop position for transfer that corresponds to the delivery device 50. The traveling path of the traveling cart 10 is set so as to pass through stop positions for transfer that correspond to the delivery devices 50. The stop positions for transfer that correspond to the delivery devices 50 are set at the same position as the corresponding delivery device 50 in the width direction Y (in the present embodiment, the direction corresponding to the traveling direction of the traveling cart 10). In the present embodiment, the stop position for transfer that corresponds to a delivery device 50 is set at a position where the second support body 52 included in the delivery device 50 is overlapped with the traveling cart 10 in a vertical view. While the traveling cart 10 is traveling, the self-propelled cart 33 is positioned on the elevation unit 20, and the elevation unit 20 is maintained at the traveling height H1.

While the traveling cart 10 is stopped at the stop position for transfer that corresponds to the delivery device 50, the elevation device 13 raises or lowers the elevation unit 20 from the traveling height H1 to the transfer height H2. In the present embodiment, the elevation device 13 lowers the elevation unit 20 from the traveling height H1 to the transfer height H2. While the elevation unit 20 is positioned at the transfer height H2 by the positioning portion 53, the article W is transferred between the holder 31 and the delivery device 50 as described above. After the article W is transferred between the holder 31 and the delivery device 50, the elevation device 13 raises or lowers the elevation unit 20 from the transfer height H2 to the traveling height H1 while the self-propelled cart 33 is positioned on the elevation unit 20.

As shown in FIG. 6, in the present embodiment, the delivery device 50 includes elevation guides 57. The elevation guides 57 guide the elevation unit 20 such that the elevation unit 20 is positioned by the positioning portion 53 during the raising or lowering of the elevation unit 20 to the transfer height H2. If the elevation unit 20 is horizontally displaced from a reference position, which is the position of the elevation unit 20 while being positioned by the positioning portion 53 (i.e., the position in a vertical view), the elevation guides 57 come into contact with the elevation unit 20 to correct the position thereof to the reference position (correct the position in the horizontal direction; the same applies hereinafter).

The elevation guides 57 include guiding surfaces 57a for correcting displacement of the elevation unit 20 (here, the elevation body 21) by coming into contact with guided portions 24 formed on the elevation unit 20. The guiding surfaces 57a each include a guiding surface for correcting displacement toward the first side X1 in the traveling path direction (specifically, an inclined surface that moves downward (downward side Z2) while extending toward the second side X2 in the traveling path direction), a guiding surface for correcting displacement toward the second side X2 in the traveling path direction (specifically, an inclined surface that moves downward ($t_{oward}$ the downward side Z2) while extending toward the first side X1 in the traveling path direction), a guiding surface for correcting displacement toward the first side Y1 in the width direction (specifically, an inclined surface that moves downward ($t_{oward}$ the downward side Z2) while extending toward the second side Y2 in the width direction), and a guiding surface for correcting displacement toward the second side Y2 in the width direction (specifically, an inclined surface that moves downward (toward the downward side Z2) while extending toward the first side Y1 in the width direction), and the position of the elevation unit 20 can be corrected to the reference position regardless of the direction in which the elevation unit 20 is displaced from the reference position in the horizontal plane.

In this example, the portion of each of the elevation guides 57 that is lower than (on the downward side Z2 of) the guiding surface 57a is a vertical surface that comes into contact with the guided portion 24 so as to restrict movement of the elevation unit 20 in the horizontal direction, and after the position of the elevation unit 20 has been corrected to the reference position by the guiding surface 57a, the elevation unit 20 can be held at the reference position by the vertical surface.

As shown in FIG. 6, in the present embodiment, the elevation guides 57 are formed on the upper surface of the second support body 52 so as to protrude toward the upward side Z1. Here, the delivery device 50 has two elevation guides 57, namely a first elevation guide 571 and a second elevation guide 572. The elevation unit 20 (here, the elevation body 21) includes two guided portions 24, namely a first guided portion 241 and a second guided portion 242 (see FIG. 3), and here, the guiding surface 57a of the first elevation guide 571 corrects displacement of the elevation unit 20 by coming into contact with the first guided portion 241, and the guiding surface 57a of the second elevation guide 572 corrects displacement of the elevation unit 20 by coming into contact with the second guided portion 242.

The first guided portion 241 and the second guided portion 242 are formed so as to pass through the elevation body 21 in the up-down direction Z. As shown in FIG. 3, the first guided portion 241 is formed with a shape that extends along the outer edge of the guiding surface 57a of the first elevation guide 571 in a vertical view, and the second guided portion 242 is formed with a shape that extends along the outer edge of the guiding surface 57a of the second elevation guide 572 in a vertical view. In this example, the guiding surface 57a of the first elevation guide 571 includes a guiding surface for correcting displacement toward the first side X1 in the traveling path direction, a guiding surface for correcting displacement toward the second side X2 in the traveling path direction, and a guiding surface for correcting displacement toward the first side Y1 in the width direction. The guiding surface 57a of the second elevation guide 572 includes a guiding surface for correcting displacement toward the first side X1 in the traveling path direction, a guiding surface for correcting displacement toward the second side X2 in the traveling path direction, and a guiding surface for correcting displacement toward the second side Y2 in the width direction.

Due to the delivery device 50 including the elevation guides 57 as described above, even if the elevation unit 20 becomes horizontally displaced from the reference position due to swinging of the elevation unit 20 or the like when the elevation unit 20 is raised or lowered to the transfer height H2, the guiding operation of the elevation guide 57 makes it possible to appropriately move the elevation unit 20 so as to be positioned by the positioning portion 53. In the present embodiment, the transfer height H2 is set lower than (downward side Z2) the traveling height H1. Also, in the present embodiment, as shown in FIG. 7, the elevation guides 57 are provided such that a guide start position G, which is the position at which the guiding of the elevation unit 20 by the elevation guides 57 is started, is located higher than (on the upward side Z1) the upper end of the delivery-side guide 55. Accordingly, even if the elevation unit 20 is displaced horizontally from the reference position when the elevation unit 20 is lowered to the transfer height H2, it is possible to avoid contact between the elevation unit 20 and the delivery-side guide 55 that may result in damage to the delivery-side guide 55. In the present embodiment, the guide start position G is the position where the lower end of the guided portion 24 (here, the lower (downward side Z2) opening edge of the through hole that forms the guided portion 24) is located at the same height as the upper ends of the elevation guides 57 (here, the upper ends of the guiding surfaces 57a).

The phrase "the guide start position G is located higher than (upward side Z1) the upper end of the delivery-side guide 55" means "at least the end portion, on the first side X1 in the traveling path direction, of the elevation unit 20 at the guide start position G (specifically, the lower end of that end portion) is located higher than (on the upward side Z1) the upper end of the delivery-side guide 55". As shown in FIG. 7, in the present embodiment, while the elevation unit 20 is located at the guide start position G, the positioned portion 22 is positioned lower than (on the downward side Z2 of) the upper end of the delivery-side guide 55, whereas the end portion of the elevation unit 20 on the first side X1 in the traveling path direction is located higher than (on the upward side Z1 of) the upper end of the delivery-side guide 55. The guide start position G can also be the position of the end portion of the elevation unit 20 on the first side X1 in the traveling path direction (specifically, the lower end of that end portion) at the time when the guiding of the elevation unit 20 by the elevation guides 57 starts.

While the traveling cart 10 is in motion, the self-propelled cart 33 is arranged at the predetermined position P (see FIG. 1) set on the elevation unit 20. The elevation unit 20 includes a restriction mechanism 27 that can change in state between a restricting state and a non-restricting state. Here, the restricting state is a state in which the movement of the self-propelled cart 33 is restricted when the self-propelled cart 33 is at the predetermined position P, and the non-restricting state is a state in which the movement of the self-propelled cart 33 is not restricted. The state of the restriction mechanism 27 is set to the restricting state while the traveling cart 10 is in motion. This makes it possible to prevent unintended movement of the self-propelled cart 33 during traveling of the traveling cart 10. By setting the state of the restriction mechanism 27 to the restricting state during the raising and lowering of the elevation unit 20 as well, it is possible to prevent unintended movement of the self-propelled cart 33 during the raising and lowering of the elevation unit 20 as well. The state of the restriction mechanism 27 is also set to the non-restricting state during the transfer of an article W to the delivery device 50 by the transfer device 30. This allows the self-propelled cart 33 to move between the elevation unit 20 and the delivery device 50 in order to transfer an article W between the holder 31 and the delivery device 50.

Two specific examples of the restriction mechanism 27 will be described below, but the configuration of the restriction mechanism 27 is not limited to these examples, and a plurality of restriction mechanisms 27 can also be used together.

For example, if the wheel drive source 34 is provided with a brake (e.g., a non-excitation actuated electromagnetic brake that applies braking force when not supplied with power), the restriction mechanism 27 can be a mechanism that changes between the restricting state and the non-restricting state by controlling the actuation state of the brake. In this case, by actuating the brake to restrict rotation of the wheel 35 when the self-propelled cart 33 is at the predetermined position P, the state of the restriction mechanism 27 is set to the restricting state, whereas by releasing the brake to allow rotation of the wheel 35, the state of the restriction mechanism 27 is set to the non-restricting state.

As another example, a configuration is also possible in which the state of the restriction mechanism 27 is changed using upward and downward movement of the elevation unit 20. In the example shown in FIG. 1, the restriction mechanism 27 is a mechanism that changes in state between the restricting state and the non-restricting state with use of a restriction pin 16 provided on the main body portion of the article transport vehicle 1 (a portion coupled to the traveling cart 10) and a restriction hole 28 provided in the self-propelled cart 33. The restriction pin 16 and the restriction hole 28 are provided at positions where the restriction pin 16 can be inserted into the restriction hole 28 when the self-propelled cart 33 is at the predetermined position P, and the movement of the self-propelled cart 33 is restricted when the restriction pin 16 is inserted into the restriction hole 28. Note that the restriction hole 28 is not shown in drawings other than FIG. 1.

If the restriction pin 16 is withdrawn from the restriction hole 28 while the elevation unit 20 is positioned at a height other than the traveling height H1 (e.g., the transfer height 112), the state of the restriction mechanism 27 is changed to the non-restricting state, whereas if the restriction pin 16 is inserted into the restriction hole 28 while the elevation unit 20 is positioned at the traveling height H1, the state of the restriction mechanism 27 is changed to the restricting state (see the self-propelled cart 33 shown by dashed-dotted lines in FIG. 1). When the elevation unit 20 is raised or lowered from a height other than the traveling height H1 to the traveling height H1 while the self-propelled cart 33 is at the predetermined position P, the restriction pin 16 is inserted into the restriction hole 28 (here, inserted from above (upward side Z1)), and thus the state of the restriction mechanism 27 is changed from the non-restricting state to the restricting state. When the elevation unit 20 is raised or lowered from the traveling height H1 to a height other than the traveling height H1, the restriction pin 16 is withdrawn from the restriction hole 28, and thus the state of the restriction mechanism 27 is changed from the restricting state to the non-restricting state. In this way, in the example shown in FIG. 1, the state of the restriction mechanism 27 is changed from the non-restricting state to the restricting state with use of upward or downward movement of the elevation unit 20 to the traveling height H1 (in the present embodiment, upward movement), and the state of the restriction mechanism 27 is changed from the restricting state to the non-restricting state with use of upward or downward movement of the elevation unit 20 to the traveling height H1 (in the present embodiment, downward movement).

The following describes other embodiments of the article transport facility.

(1) In the above embodiments, a configuration is illustrated in which the delivery-side guide 55 and the elevation-side guide 25 are gear racks (26, 56). However, the present disclosure is not limited to such a configuration, and the delivery-side guide 55 and elevation-side guide 25 can be configured as guides that are not gear racks. Examples of guides that are not gear racks include a guide rail that engages with a guide block provided on the self-propelled cart 33, and a guide frame that comes into contact with a side surface of the self-propelled cart 33. Even in the case where the delivery-side guide 55 and the elevation-side guide 25 are guides that are not gear racks, if the wheel 35 includes the drive pinion gear 36, gear racks (26, 56) are provided similarly to the above embodiment. In this case, the gear racks (26, 56) do not need to guide the traveling of the self-propelled cart 33 along the traveling path T, and thus the guide wheels 38 may be omitted. If guide wheels 38 are not provided, a configuration is possible in which, for example, the gear racks (26, 56) are arranged with tooth surfaces that face the upward side Z1, and the drive pinion gear 36 is supported so as to rotate about an axis extending along the horizontal direction.

(2) In the above embodiments, a configuration is illustrated in which the wheel 35 includes only the drive pinion gear 36. However, the present disclosure is not limited to such a configuration, and the wheel 35 can be configured to include another wheel member in addition to the drive pinion gear 36. For example, the wheel 35 can be configured to include the drive pinion gear 36 and a support wheel 39, and in this case, the wheel drive source 34 is provided so as to drive the drive pinion gear 36 and the support wheel 39. If the wheel 35 includes a wheel member other than the drive pinion gear 36, the wheel 35 can be configured without the drive pinion gear 36. If the wheel 35 includes the support wheel 39, the self-propelled cart 33 can be caused to travel by transmitting driving force from the wheel drive source 34 to the traveling surface of the self-propelled cart 33 via friction between the support wheel 39 and the traveling surface.

(3) In the above embodiments, a configuration is illustrated in which the delivery device 50 includes the positioning portion 53 and the elevation guides 57, which are separate members. However, the present disclosure is not limited to such a configuration, and the delivery device 50 can be configured to include a member that functions as both the positioning portion 53 and the elevation guides 57. In the above embodiment, movement of the elevation unit 20 in the horizontal direction can be restricted by the previously-described vertical surfaces of the elevation guides 57, and therefore the members constituting the elevation guides 57 in the above embodiment can be configured to function as the positioning portion 53 as well, for example.

(4) In the above embodiments, a configuration is illustrated in which the elevation guides 57 are provided such that the guide start position G is located higher than (on the upward side Z1 of) the upper end of the delivery-side guide 55. However, the present disclosure is not limited to such a configuration, and if the elevation unit 20 swings little during the raising and lowering of the elevation unit 20 for example, a configuration is possible in which the guide start position G is positioned at the same height as, or lower than (on the downward side Z2 of) the upper end of the delivery-side guide 55. Also, if the elevation unit 20 swings little during the raising and lowering of the elevation unit 20 for example, a configuration is also possible in which the delivery device 50 does not include the elevation guides 57.

(5) In the above embodiments, a configuration is illustrated in which the transfer device 30 includes the connection wiring 40 that connects the elevation unit 20 and the self-propelled cart 33. However, the present disclosure is not limited to such a configuration, and the connection wiring 40 can be omitted if a power storage device is provided in the self-propelled cart 33, or the controller of the article transport vehicle 1 and the self-propelled cart 33 perform wireless communication with each other, for example.

(6) In the above embodiments, a configuration is illustrated in which the holder 31 holds an article W by supporting the article W from below (downward side Z2). However, the present disclosure is not limited to such a configuration, and the holder 31 can be configured to hold the article W from above (upward side Z1), for example. Specifically, the holder 31 can be configured to hold the article W from above (upward side Z1) by gripping a flange portion formed on an upper portion of the article W or an outer peripheral portion of an upper portion of the article W, for example.

(7) In the above embodiments, a configuration is illustrated in which the transfer height H2 is set lower than (on the downward side Z2 of) the traveling height H1. However, the present disclosure is not limited to such a configuration, and a configuration is possible in which the transfer height H2 is set higher than (on the upward side Z1 of) the traveling height H1. For example, in the case where the article transport vehicle 1 is a carrier vehicle that travels autonomously on a floor surface, and the delivery device 50 is arranged above (on the upward side Z1 of) the traveling path of the traveling cart 10, the transfer height H2 is set higher than (on the upward side Z1 of) the traveling height H1.

(8) Note that configurations disclosed in each of the embodiments described above can be applied in combination with configurations disclosed in other embodiments (including combinations between embodiments described as other embodiments), as long as no contradiction arises. Regarding the other configurations as well, the embodiments disclosed in the present specification are merely examples in all respects. Accordingly, various modifications can be made as appropriate within a scope that does not depart from the gist of this disclosure.

The following describes a summary of embodiments of the article transport facility described above.

An article transport facility including: an article transport vehicle configured to transport an article; and a delivery device configured to be a delivery destination of the article transported by the article transport vehicle, wherein the article transport vehicle includes: a traveling cart configured to travel; an elevation unit configured to be raised and lowered relative to the traveling cart; and a transfer device mounted on the elevation unit, the elevation unit is raised and lowered between a traveling height that is a reference height during traveling of the traveling cart, and a transfer height for transfer of the article with the delivery device by the transfer device, the transfer device includes: a holder configured to hold the article; and a self-propelled cart configured to support the holder and travel, the self-propelled cart includes: a wheel; and a wheel drive source configured to drive the wheel, the self-propelled cart travels along a traveling path provided on the elevation unit and the delivery device, the delivery device includes: a positioning portion configured to position the elevation unit while the elevation unit is at the transfer height; and a delivery-side guide configured to guide travel of the self-propelled cart along the traveling path, the elevation unit includes an elevation-side guide configured to guide travel of the self-propelled cart along the traveling path, and the elevation-side guide is arranged in such a manner as to be continuous with the delivery-side guide while the elevation unit is positioned by the positioning portion.

According to this configuration, the elevation-side guide and the delivery-side guide are arranged so as to be continuous with each other while the elevation unit is positioned by the positioning portion of the delivery device, and thus the traveling of the self-propelled cart can be guided by the elevation-side guide and the delivery-side guide over the entirety of the traveling path between the elevation unit and the delivery device. Accordingly, the self-propelled cart and the holder supported thereby can be appropriately guided to the transfer position where the article is transferred between the holder and the delivery device.

In this configuration, in the portion of the traveling path on the elevation unit side of the junction between the elevation-side guide and the delivery-side guide, the traveling of the self-propelled cart is guided by the elevation-side guide provided in the elevation unit, and in the portion of the traveling path on the delivery device side of the junction, the traveling of the self-propelled cart is guided by the delivery-side guide provided in the delivery device. In this way, the traveling of the self-propelled cart in the portion of the traveling path on the delivery device side is guided by the delivery-side guide provided in the delivery device, and thus the configuration of the elevation-side guide can be made simpler than in the case where the elevation-side guide provided in the elevation unit guides the traveling of the self-propelled cart in the portion on the delivery device side as well. As a result, it is easier to reduce the weight of the elevation unit on which the transfer device is mounted, and thus reduce the weight of the article transport vehicle.

As described above, according to the above configuration, it is possible to facilitate reduction of the weight of the article transport vehicle while also enabling the holder to be appropriately guided to a transfer position where article transfer is to be performed.

Here, it is preferable that the delivery device further includes an elevation guide configured to guide the elevation unit such that the elevation unit is positioned by the positioning portion during raising or lowering of the elevation unit to the transfer height.

According to this configuration, even if horizontal displacement occurs between the elevation unit and the delivery device due to swinging of the elevation unit when the elevation unit is raised or lowered to the transfer height, the guiding operation of the elevation guide makes it possible to appropriately move the elevation unit so as to be positioned by the positioning portion.

In the configuration in which the delivery device includes the elevation guide, it is preferable that the transfer height is set lower than the traveling height, and the elevation guide is provided such that a guide start position, at which guiding of the elevation unit by the elevation guide starts, is higher than an upper end of the delivery-side guide.

According to this configuration, even if horizontal displacement occurs between the elevation unit and the delivery device due to swinging of the elevation unit when the elevation unit is lowered to the transfer height, the guiding operation of the elevation guide makes it possible to appropriately move the elevation unit so as to be positioned by the positioning portion. Furthermore, according to this configuration, the guiding of the elevation unit by the elevation guide can start at a position higher than the upper end of the delivery-side guide, and therefore even if the aforementioned displacement occurs, it is possible to avoid contact between the elevation unit and the delivery-side guide that may result in damage to the delivery-side guide.

In the article transport facility having the above configurations, it is preferable that the delivery-side guide and the elevation-side guide are each a gear rack, and the wheel includes a pinion gear configured to mesh with the gear racks.

According to this configuration, driving force from the wheel drive source can be efficiently transmitted to the gear rack constituting the delivery-side guide or the elevation-side guide via the meshing of the pinion gear with the gear rack, thus allowing the self-propelled cart to travel along the traveling path. Also, according to this configuration, the position of the self-propelled cart along the traveling path can be controlled relatively easily based on the amount of rotation along the gear rack, and therefore the self-propelled cart can also be positioned relatively easily.

In the configuration in which the delivery-side guide and the elevation-side guide are gear racks, and furthermore the wheel includes the pinion gear, it is preferable that the gear racks are arranged in such a manner as to extend in a traveling path direction that is parallel with the traveling path, tooth surfaces of the gear racks are arranged in such a manner as to face one side in a width direction orthogonal to the traveling path direction in a vertical view along an up-down direction, the pinion gear is supported in such a manner as to rotate about an axis extending in the up-down direction, the self-propelled cart further includes a guide wheel supported in such a manner as to rotate about an axis extending in the up-down direction, and the guide wheel is arranged in such a manner as to rotate along back surfaces of the gear racks, the back surfaces facing another side in the width direction.

According to this configuration, the gear rack constituting the delivery-side guide or the elevation-side guide is sandwiched from both sides in the width direction by the pinion gear and guide wheel, and the self-propelled cart can be caused to travel by rotating the pinion gear. Accordingly, the self-propelled cart can be caused to travel along the traveling path direction along which the gear rack extends, while also restricting movement of the self-propelled cart in the width direction relative to the gear rack. In this way, according to the above configuration, the linearity of the gear rack constituting the delivery-side guide or the elevation-side guide can be used to appropriately achieve both the driving and the guiding of the self-propelled cart.

In the article transport facility having the above configurations, it is preferable that the transfer device further includes a connection wiring configured to connect the elevation unit and the self-propelled cart, the connection wiring has a first portion that is fixed to the self-propelled cart, the connection wiring has a second portion different from the first portion, the second portion being fixed to the elevation unit, and the first portion and the second portion are separated by a distance along the connection wiring that corresponds to a length of a traveling range of the self-propelled cart along the traveling path.

According to this configuration, the connection wiring can be used to supply power from the elevation unit to the self-propelled cart and to transmit and receive signals between the elevation unit and the self-propelled cart, for example. Also, according to the above configuration, the distance between the first portion and the second portion along the connection wiring is set as described above, thus making it possible to avoid the case where the traveling of the self-propelled cart is obstructed by the connection wiring.

Also, it is preferable that the elevation unit further includes a restriction mechanism configured to change in state between a restricting state in which movement of the self-propelled cart is restricted while the self-propelled cart is at a predetermined position set on the elevation unit, and a non-restricting state in which movement of the self-propelled cart is not restricted, and the state of the restriction mechanism is changed with use of upward and downward movement of the elevation unit.

According to this configuration, setting the state of the restriction mechanism to the restricting state makes it possible to restrict unintended movement of the self-propelled cart relative to the elevation unit during traveling of the traveling cart or the raising/lowering of the elevation unit, for example. Also, according to the above configuration, the state of the restriction mechanism can be changed using upward and downward movement of the elevation unit, thereby also making it possible to simplify control and the configuration for changing the state of the restriction mechanism The article transport facility according to an aspect of the present disclosure need only be able to achieve at least one of the effects described above.

What is claimed is:

1. An article transport facility comprising:
an article transport vehicle configured to transport an article; and
a delivery device configured to be a delivery destination of the article transported by the article transport vehicle,
wherein the article transport vehicle comprises:
a traveling cart configured to travel;
an elevation unit configured to be raised and lowered relative to the traveling cart; and
a transfer device mounted on the elevation unit,
wherein the elevation unit is raised and lowered between
a traveling height that is a reference height during traveling of the traveling cart, and a transfer height for transfer of the article with the delivery device by the transfer device,
wherein the transfer device comprises:
a holder configured to hold the article; and
a self-propelled cart configured to support the holder and travel,
wherein the self-propelled cart comprises:
a wheel; and
a wheel drive source configured to drive the wheel,
wherein the self-propelled cart travels along a traveling path provided on the elevation unit and the delivery device,
wherein the delivery device comprises:
a positioning portion configured to position the elevation unit while the elevation unit is at the transfer height; and
a delivery-side guide configured to guide travel of the self-propelled cart along the traveling path,
wherein the elevation unit comprises an elevation-side guide configured to guide travel of the self-propelled cart along the traveling path,
wherein the elevation-side guide is arranged in such a manner as to be continuous with the delivery-side guide while the elevation unit is positioned by the positioning portion
wherein the delivery device further comprises an elevation guide configured to guide the elevation unit such that the elevation unit is positioned by the positioning portion during raising or lowering of the elevation unit to the transfer height, and
wherein the elevation guide includes at least one guiding surface configured to contact the elevation unit to correct displacement of the elevation unit.

2. The article transport facility according to claim 1,
wherein the transfer height is set lower than the traveling height, and
wherein the elevation guide is provided such that a guide start position, at which guiding of the elevation unit by the elevation guide starts, is higher than an upper end of the delivery-side guide.

3. The article transport facility according to claim 1,
wherein the delivery-side guide and the elevation-side guide are each a gear rack, and
wherein the wheel comprises a pinion gear configured to mesh with the gear racks.

4. The article transport facility according to claim 3,
wherein:
the gear racks are arranged in such a manner as to extend in a traveling path direction that is parallel with the traveling path,
tooth surfaces of the gear racks are arranged in such a manner as to face one side in a width direction orthogonal to the traveling path direction in a vertical view along an up-down direction,
the pinion gear is supported in such a manner as to rotate about an axis extending in the up-down direction,
the self-propelled cart further comprises a guide wheel supported in such a manner as to rotate about an axis extending in the up-down direction, and
the guide wheel is arranged in such a manner as to rotate along back surfaces of the gear racks, the back surfaces facing another side in the width direction.

5. The article transport facility according to claim 1,
wherein:
the transfer device further comprises a connection wiring configured to connect the elevation unit and the self-propelled cart,
the connection wiring has a first portion that is fixed to the self-propelled cart, the connection wiring has a second portion different from the first portion, the second portion fixed to the elevation unit, and the first portion and the second portion are separated by a distance along the connection wiring that corresponds to a length of a traveling range of the self-propelled cart along the traveling path.

6. The article transport facility according to claim 1, wherein the elevation unit further comprises a restriction mechanism configured to change in state between a restricting state in which movement of the self-propelled cart is restricted while the self-propelled cart is at a predetermined position set on the elevation unit, and a non-restricting state in which movement of the self-propelled cart is not restricted, and wherein the state of the restriction mechanism is changed with use of upward and downward movement of the elevation unit.

\* \* \* \* \*

UNITED STATES PATENT AND TRADEMARK OFFICE
CERTIFICATE OF CORRECTION

| | | |
|---|---|---|
| PATENT NO. | : 11,873,199 B2 | |
| APPLICATION NO. | : 17/748538 | |
| DATED | : January 16, 2024 | |
| INVENTOR(S) | : Yoshinari Wada | |

It is certified that error appears in the above-identified patent and that said Letters Patent is hereby corrected as shown below:

In the Claims

Column 20, Line 22, Claim 1, delete "portion" and insert -- portion, --

Signed and Sealed this
Eleventh Day of June, 2024

Katherine Kelly Vidal
*Director of the United States Patent and Trademark Office*